United States Patent
Woo et al.

(10) Patent No.: US 9,166,195 B2
(45) Date of Patent: Oct. 20, 2015

(54) ORGANIC LIGHT EMITTING DISPLAY

(71) Applicant: LG DISPLAY CO., LTD., Seoul (KR)

(72) Inventors: Sangwook Woo, Goyang-si (KR); Dongsik Park, Seoul (KR); Sungeui Shin, Paju-si (KR); Sanghak Shin, Goyang-si (KR)

(73) Assignee: LG DISPLAY CO., LTD., Seoul (KR)

(*) Notice: Subject to any disclaimer, the term of this patent is extended or adjusted under 35 U.S.C. 154(b) by 0 days.

(21) Appl. No.: 14/088,054

(22) Filed: Nov. 22, 2013

(65) Prior Publication Data

US 2014/0145165 A1 May 29, 2014

(30) Foreign Application Priority Data

Nov. 23, 2012 (KR) .................. 10-2012-0134051

(51) Int. Cl.
  *H01L 35/24* (2006.01)
  *H01L 51/52* (2006.01)

(52) U.S. Cl.
  CPC .................................. *H01L 51/5256* (2013.01)

(58) Field of Classification Search
  CPC . H01L 22/12; H01L 29/7875; H01L 29/7878; H01L 51/5271; H01L 51/5268; H01L 51/0096; H01L 51/56; H01L 21/02521; H01L 21/02546; H01L 21/02579; H01L 21/0262; H01L 21/02642; H01L 21/02647; H01L 33/007; H01L 33/641; H01L 21/0237; H01L 21/0242; H01L 21/02458; H01L 33/36; H01L 33/64; H01L 21/0254; Y10S 977/742

USPC ......... 257/12–13, 40, 81, 84, 87–89, 98–100, 257/347–348, 433–434; 313/112, 501, 503, 313/506–507
See application file for complete search history.

(56) References Cited

U.S. PATENT DOCUMENTS

| 7,875,895 B2* | 1/2011 | Kwack et al. ............... 257/98 |
| 2011/0140164 A1* | 6/2011 | Seo et al. ............... 257/100 |
| 2012/0261613 A1* | 10/2012 | Kim et al. ............... 252/194 |
| 2013/0099658 A1* | 4/2013 | Tsai et al. ............... 313/504 |
| 2014/0027722 A1* | 1/2014 | Lee et al. ............... 257/40 |

OTHER PUBLICATIONS

Korean patent application papers for Appl. No. 10-2012-0061004.
English translation of Application Data Sheet and Abstract.

* cited by examiner

*Primary Examiner* — Dung Le
(74) *Attorney, Agent, or Firm* — Birch, Stewart, Kolasch & Birch, LLP

(57) ABSTRACT

An organic light emitting display is discussed. The organic light emitting display includes a substrate, an organic light emitting diode positioned on the substrate, and a bather covering the organic light emitting diode. The organic light emitting diode includes a first electrode, an organic layer, and a second electrode. The barrier includes at least one first block monomer layer and at least one second block monomer layer including inorganic precursors. The at least one first block monomer layer and the at least one second block monomer layer are alternately stacked in a vertical direction.

7 Claims, 5 Drawing Sheets

ORGANIC LIGHT EMITTING DISPLAY

This application claims the priority benefit of Korean Patent Application No. 10-2012-0134051 filed on Nov. 23, 2012, which is incorporated herein by reference for all purposes as if fully set forth herein.

BACKGROUND OF THE INVENTION

1. Field of the Invention

Embodiments of the invention relate to an organic light emitting display and a method for manufacturing the same, and more particularly, to an organic light emitting display and a method for manufacturing the same capable of preventing generation of degraded elements resulting from moisture penetration and easily performing a manufacturing process.

2. Discussion of the Related Art

The importance of flat panel displays is recently increasing with growth of multimedia. Thus, various types of flat panel displays such as a liquid crystal display (LCD), a plasma display panel (PDP), a field emission display (FED), and an organic light emitting display have been put to practical use to meet this trend.

In particular, the organic light emitting display having a self-emitting structure has advantages of a fast response time of 1 ms or less and low power consumption. Further, the organic light emitting display has a wide viewing angle and thus can be used as a motion picture display regardless of the size of display devices. Because the organic light emitting display can be manufactured at a low temperature through a simple manufacturing process based on an existing semiconductor process technology, the organic light emitting display has been considered as a next generation display.

In a related art, the organic light emitting display was manufactured by forming an organic light emitting diode including a first electrode, an organic layer, and a second electrode on a substrate and then sealing an encapsulation substrate formed of glass or metal with the substrate using an adhesive. However, it was difficult to achieve a thin profile of the organic light emitting display due to the use of the encapsulation substrate, and such an organic light emitting display had the problem of weak durability.

An organic light emitting display has been recently manufactured by stacking and sealing a plurality of thin films including inorganic layers and organic layers on an organic light emitting diode. However, it takes much time to alternately stack the inorganic layers and the organic layers, and the structure of the organic light emitting display becomes complicated. Further, particles are produced in a process for staking the inorganic layers using a low temperature plasma enhanced chemical vapor deposition (PECVD) method and thus provide a penetration path for moisture.

SUMMARY OF THE INVENTION

Embodiments of the invention provide an organic light emitting display and a method for manufacturing the same capable of preventing the generation of degraded elements resulting from moisture penetration and easily performing a manufacturing process.

In one aspect, there is an organic light emitting display including a substrate, an organic light emitting diode positioned on the substrate, the organic light emitting diode including a first electrode, an organic layer, and a second electrode, and a barrier configured to cover the organic light emitting diode, the barrier including at least one first block monomer layer and at least one second block monomer layer including inorganic precursors.

In another aspect, there is a method for manufacturing an organic light emitting display including forming an organic light emitting diode including a first electrode, an organic layer, and a second electrode on a substrate, coating a block copolymer having first block monomers and second block monomers including inorganic precursors on a base film and performing an annealing process on the block copolymer to form a bather including at least one first block monomer layer and at least one second block monomer layer including the inorganic precursors, and placing an adhesive on the barrier and attaching the barrier to the organic light emitting diode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It should be noted that detailed description of known arts will be omitted if such known arts would obscure the embodiments of the invention.

Figure 1:
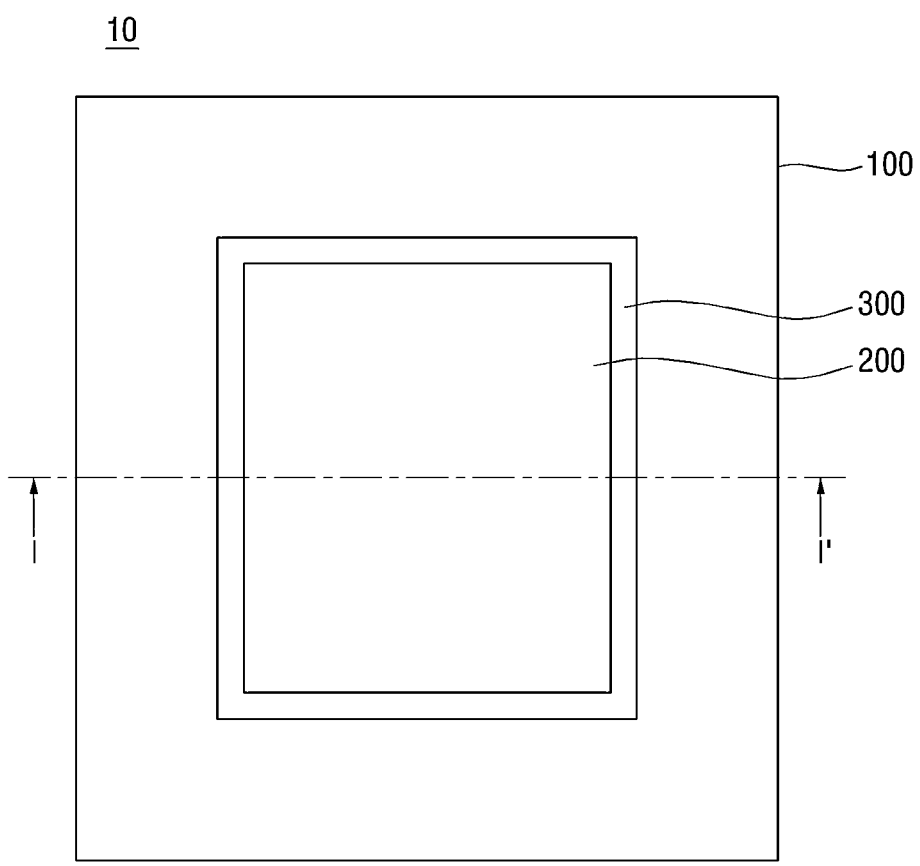
FIG. 1 is a plan view of an organic light emitting display according to an example embodiment of the invention.
Figure 2:
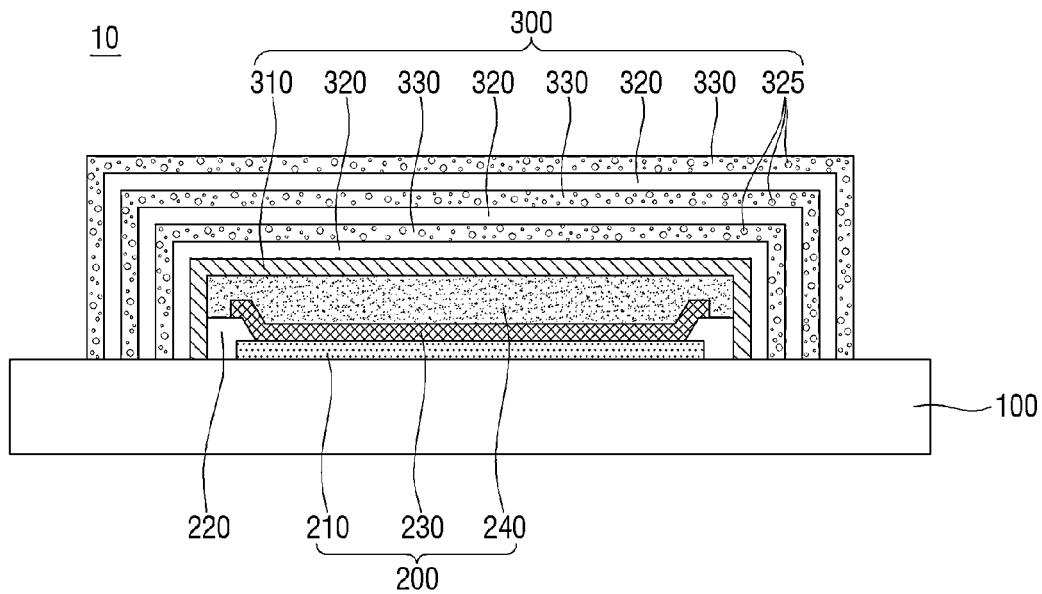
FIG. 2 is a cross-sectional view taken along line I-I' of FIG. 1 according to an example embodiment of the invention.
Figure 3:
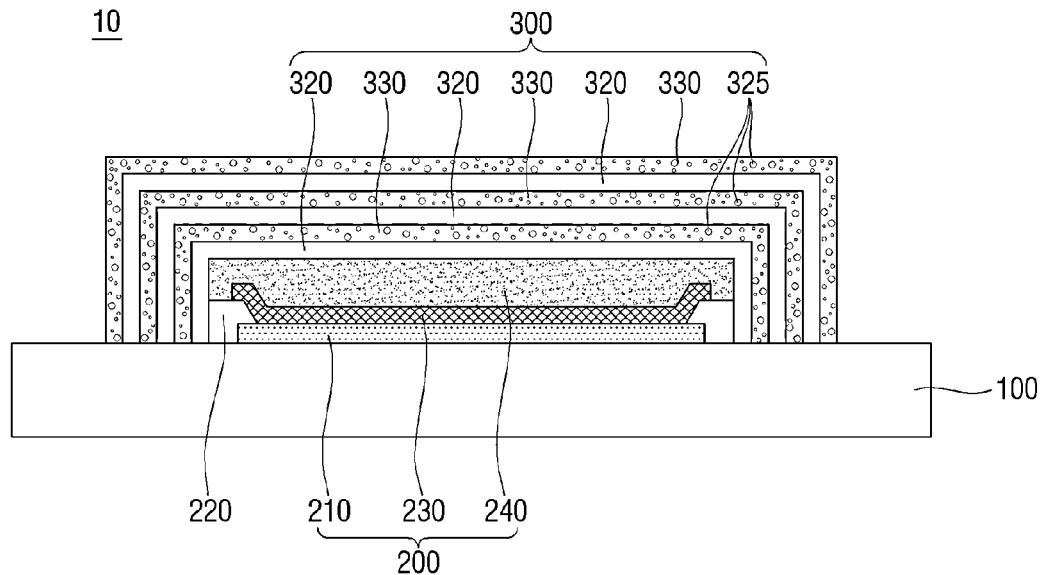
FIG. 3 is a cross-sectional view of an organic light emitting display according to another example embodiment of the invention.

FIG. 1 is a plan view of an organic light emitting display according to an example embodiment of the invention. FIG. 2 is a cross-sectional view taken along line I-I' of FIG. 1. FIG. 3 is a cross-sectional view of an organic light emitting display according to another example embodiment of the invention.

As shown in FIGS. 1 and 2, an organic light emitting display 10 according to an example embodiment of the invention includes a substrate 100, an organic light emitting diode 200 formed on the substrate 100, and a bather 300 covering the organic light emitting diode 200.

More specifically, the organic light emitting diode 200 is positioned on the substrate 100. The substrate 100 may be a transparent substrate formed of glass, plastic, or a conductive material, for example. The organic light emitting diode 200 positioned on the substrate 100 includes a first electrode 210, an organic layer 230, and a second electrode 240.

The first electrode 210 may be an anode electrode. Further, the first electrode 210 may be a transparent electrode or a reflection electrode. If the first electrode 210 is the transparent electrode, the first electrode 210 may be formed of one of indium tin oxide (ITO), indium zinc oxide (IZO), and zinc oxide (ZnO). If the first electrode 210 is the reflection electrode, the first electrode 210 may include a layer formed of one of ITO, IZO and ZnO and also a reflective layer formed under the layer using one of aluminum (Al), silver (Ag), and nickel (Ni). Further, the first electrode 210 serving as the reflection electrode may include the reflective layer between two layers formed of one of ITO, IZO and ZnO.

The first electrode 210 may be formed using a sputtering method, an evaporation method, a vapor phase deposition method, or an electron beam deposition method. Other methods may be used to form the first electrode 210.

An insulating layer 220 is positioned on the substrate 100, on which the first electrode 210 is formed, and exposes a portion of the first electrode 210. The insulating layer 220 may contain an organic material such as benzocyclobutene (BCB)-based resin, acrylic based resin, and polyimide resin. Other materials may be used for the insulating layer 220.

The organic layer 230 is formed on the first electrode 210 exposed by the insulating layer 220. The organic layer 230 includes at least a light emitting layer, and may further include a hole injection layer, a hole transport layer, an electron transport layer, or an electron injection layer positioned on or under the light emitting layer.

The hole injection layer may allow holes from the first electrode 210 to be smoothly injected into the light emitting layer. The hole injection layer may be formed of at least one selected from the group consisting of copper phthalocyanine (CuPc), PEDOT(poly(3,4)-ethylenedioxythiophene), polyaniline (PANI), and NPD(N,N-dinaphthyl-N,N'-diphenyl benzidine). Other materials may be used for the hole injection layer.

The hole transport layer may smoothly perform the transport of holes. The hole transport layer may be formed of at least one selected from the group consisting of NPD(N,N-dinaphthyl-N,N'-diphenyl benzidine), TPD(N,N'-bis-(3-methylphenyl)-N,N'-bis-(phenyl)-benzidine, s-TAD, and MTDATA(4,4',4"-Tris(N-3-methylphenyl-N-phenyl-amino)-triphenylamine). Other materials may be used for the hole transport layer.

The light emitting layer may be formed of a material capable of emitting red, green, and blue light and may be formed of a phosphorescence material or a fluorescence material.

When the light emitting layer emits red light, the light emitting layer includes a host material containing carbazole biphenyl (CBP) or N,N-dicarbazolyl-3,5-benzene (mCP). The light emitting layer may be formed of a phosphorescence material including a dopant containing at least one selected from the group consisting of PIQIr(acac)(bis(1-phenylisoquinoline)acetylacetonate iridium), PQIr(acac)(bis(1-phenylquinoline)acetylacetonate iridium), PQIr(tris(1-phenylquinoline)iridium) and PtOEP(octaethylporphyrin platinum). Alternatively, the light emitting layer may be formed of a fluorescence material containing PBD:Eu(DBM) 3(Phen) or Perylene. Other materials may be used for such a light emitting layer.

When the light emitting layer emits green light, the light emitting layer includes a host material containing CBP or mCP. The light emitting layer may be formed of a phosphorescence material including a dopant containing Ir(ppy)3(fac tris(2-phenylpyridine)iridium). Alternatively, the light emitting layer may be formed of a fluorescence material containing Alq3(tris(8-hydroxyquinolino)aluminum). Other materials may be used for such a light emitting layer.

When the light emitting layer emits blue light, the light emitting layer includes a host material containing CBP or mCP. The light emitting layer may be formed of a phosphorescence material including a dopant containing $(4,6-F2ppy)_2$ Irpic. Alternatively, the light emitting layer may be formed of a fluorescence material containing any one selected from the group consisting of spiro-DPVBi, spiro-6P, distyryl-benzene (DSB), distyryl-arylene (DSA), PFO-based polymer, and PPV-based polymer. Other materials may be used for such a light emitting layer.

The electron transport layer may smoothly perform the transport of electrons. The electron transport layer may be formed of at least one selected from the group consisting of Alq3(tris(8-hydroxyquinolino)aluminum, PBD, TAZ, spiro-PBD, BAlq, and SAlq. Other materials may be used for the electrode transport layer.

The electron transport layer may prevent holes, which are injected from the first electrode 210 and then pass through the light emitting layer, from moving to the second electrode 240. In other words, the electron transport layer serves as a hole stop layer, thereby allowing holes and electrons to be efficiently combined with each other in the light emitting layer.

The electron injection layer may smoothly perform the injection of electrons. The electron injection layer may be formed of Alq3(tris(8-hydroxyquinolino)aluminum), PBD, TAZ, spiro-PBD, BAlq, or SAlq. Other materials may be used for the electron injection layer.

The electron injection layer may further contain an inorganic material. The inorganic material may further include a metal compound. The metal compound may include alkali metal or alkaline earth metal. The metal compound including the alkali metal or the alkaline earth metal may be at least one selected from the group consisting of LiQ, LiF, NaF, KF, RbF, CsF, FrF, $BeF_2$, $MgF_2$, $CaF_2$, $SrF_2$, $BaF_2$, and $RaF_2$. Other materials may be used in such an electron injection layer.

The second electrode 240 may be a cathode electrode and may be formed of magnesium (Mg), calcium (Ca), aluminum (Al), silver (Ag), or an alloy thereof having a low work function. If the organic light emitting display 10 has a top emission or dual emission structure in the embodiment of the invention, the second electrode 240 may be thin enough to transmit light. If the organic light emitting display 10 has a bottom emission structure, the second electrode 240 may be thick enough to reflect light.

The barrier 300 covering the organic light emitting diode 200 is positioned on the substrate 100. The barrier 300 may prevent the penetration of moisture and air from the outside and may protect the organic light emitting diode 200 from an external impact.

The bather 300 formed on the organic light emitting diode 200 includes an adhesive layer 310, first block monomer layers 320, and second block monomer layers 330. The first block monomer layers 320 and the second block monomer layers 330 are formed through phase separation of a block copolymer and are alternately stacked on the organic light emitting diode 200.

The embodiment of the invention relates to the bather for preventing the moisture penetration of the organic light emitting display and describes the formation of the barrier using the block copolymer obtained by combining different polymers. The block copolymer is a material obtained by combining at least two polymers each having a chemically different chain. Namely, the block copolymer is a unique polymer, in which at least two kinds of polymer chains are compulsively coupled through a chemical combination.

Because the block copolymer has a very long molecule chain, chemical and physical properties of the block copolymer are more unique than a single polymer or a homopolymer. The block copolymer may form a self assembled structure of a sphere shape, a cylinder shape, a lamellar shape, etc., having a uniform size of several to several tens of nanometers and the uniform arrangement due to the unique chemical combination.

More specifically, the block copolymer has the structure, in which at least two polymers are coupled through a covalent bond. Because at least two polymers each having different properties are coupled through the covalent bond, phase separation is generated by a mutual attraction between molecules at a predetermined temperature and a predetermined pressure. In this instance, a size and a shape of a domain formed by the phase separation depend on a size, a molecular weight, and a coupling force of each of polymer segments. Various self assembled structures of the sphere shape, the cylinder shape, the lamellar shape, etc., having the uniform size and arrangement may be made by adjusting the size, the molecular weight, and the coupling force of each polymer segment under the proper conditions.

The block copolymer forming the barrier according to the embodiment of the invention may use a double block copolymer such as polystyrene-b-poly(2-vinylpyridine)(PS-b-P2VP), polystyrene-b-poly(ethylene oxide)(PS-b-PEO), polystyrene-b-poly(methylmethacrylate)(PS-b-PMMA), polystyrene-b-poly(dimethyl-siloxane)(PS-b-PDMS), and polyimide-b-poly(ethylene oxide). Other materials may be used for the block copolymer. For example, a triple block copolymer may be used.

Further, the block copolymer includes first block monomers and second block monomers including inorganic precursors. In the embodiment of the invention, inorganic precursors having affinity to the second block monomer may be used. For example, the inorganic precursor may be formed of any one selected from the group consisting of silicon-based material, aluminum-based material, zirconium-based material, zinc-based material, tin-based material, and rare earth-based material.

The block copolymer may be formed by melting the first block monomers, the second block monomers, and the inorganic precursors in a solvent and then mixing them with a solution including inorganic precursors having high affinity to the second block monomer. In this instance, the solvent may be an organic solvent, which has been widely used, for example, toluene, xylan, benzene, or methyl benzoate. The solution thus manufactured may be coated using a spin coating method, a screen printing method, a slit coating method, etc.

Because two or more blocks of the block copolymer are coupled through the chemical combination, the macroscopic phase separation is not generated in the block copolymer. However, microphase separation is generated in the block copolymer. In this instance, a transition between an order phase (phase separation region) and a disorder phase (uniform phase region) is generated by adjusting a temperature. The transition is called an order disorder transition (ODT), and the transition temperature is called an ODT temperature.

The embodiment of the invention may form the self assembled structure using the phase separation while volatilizing the solvent at a temperature equal to or lower than the ODT temperature and also may densely form membrane of a region including the inorganic precursors through an annealing process, so as to form the stack structure of the first block monomer layers and the second block monomer layers for the formation of the bather. In this instance, it is preferable but not required, that the annealing process is performed at a temperature around a melting point of the inorganic precursors.

A volume percentage of the first block monomer layers and the second block monomer layers has to be properly adjusted so as to obtain the stack structure of the first block monomer layers and the second block monomer layers. Preferably but not necessarily, a volume percentage of the second block monomer layers may be about 35% to 65% based on the total volume of 100% including the first and second block monomer layers. When the volume percentage of the second block monomer layers is less than about 35% or greater than about 65%, it is difficult to obtain the stack structure of the first block monomer layers and the second block monomer layers.

The lower the ODT temperature is, the easier the formation of the self assembled structure becomes, so as to form the stack structure of the first block monomer layers and the second block monomer layers. Further, a melting point of an inorganic component of the inorganic precursor has to be lower than about 150° C. If the melting point of the inorganic component is higher than about 150° C., the light emitting layer of the organic light emitting diode may be damaged.

As described above, the barrier 300 according to the embodiment of the invention has the stack structure of the first block monomer layers 320 and the second block monomer layers 330 including inorganic precursors 325. In the structure of the completed barrier 300, the first block monomer layers 320 are formed as the organic layers, and the second block monomer layers 330 are formed as the inorganic layers.

The bather 300 according to the embodiment of the invention may be attached to the organic light emitting diode 200 using a bather film. As shown in FIG. 3, a mixture solution may be directly coated on the substrate 100, on which the organic light emitting diode 200 is formed, to form the bather 300.

A method for manufacturing the organic light emitting display according to the embodiment of the invention is described below with reference to FIGS. 4A to 4C. The embodiment of the invention describes the method for manufacturing the organic light emitting display using, the method for forming the barrier using the barrier film, as an example.

Figure 4A:
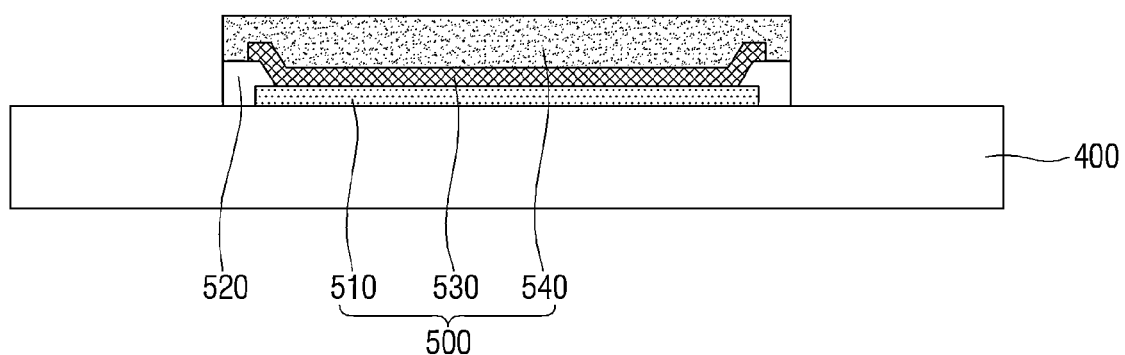
FIGS. 4A to 4C are cross-sectional views of each process showing a method for manufacturing an organic light emitting display according to an example embodiment of the invention.
Figure 4B:
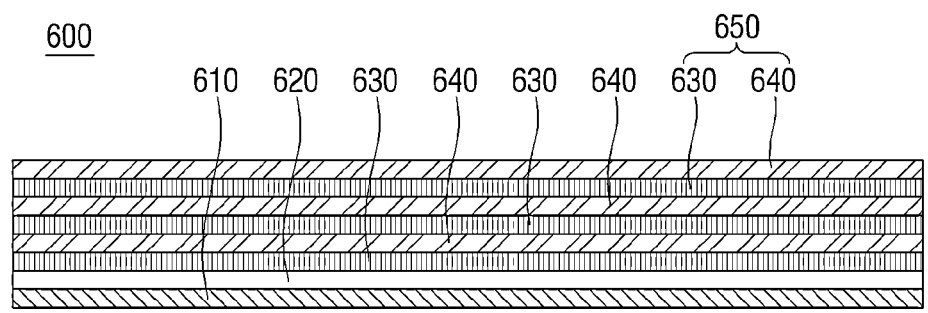
Figure 4C:
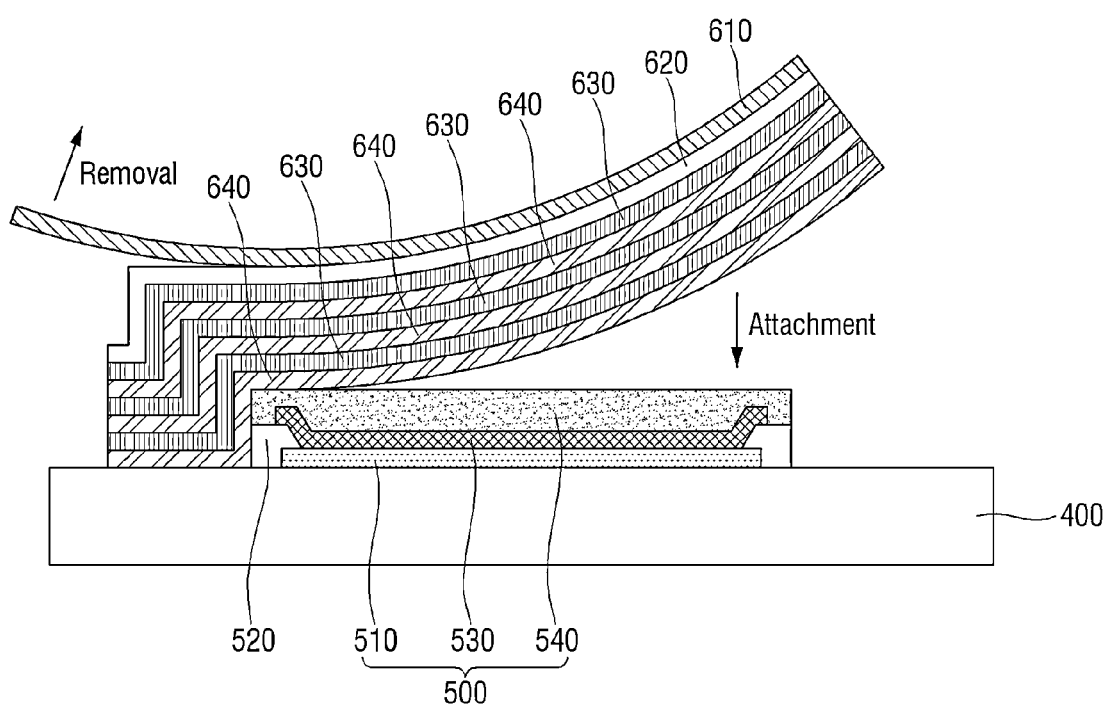

FIGS. 4A to 4C are cross-sectional views of each process showing a method for manufacturing an organic light emitting display according to the embodiment of the invention.

As shown in FIG. 4A, one of indium tin oxide (ITO), indium zinc oxide (IZO), and zinc oxide (ZnO) is deposited on a transparent substrate 400 formed of glass, plastic, or a conductive material to form a first electrode 510.

Subsequently, benzocyclobutene (BCB)-based resin, acrylic based resin, or polyimide resin is coated on the first electrode 510 using a spin coating method or a screen printing method and then is patterned using a photolithography method to form an insulating layer 520 exposing a portion of the first electrode 510.

Next, a material emitting red, green, or blue light is deposited on the first electrode 510 exposed by the insulating layer 520 to form an organic layer 530 including at least a light emitting layer. Further, a hole injection layer, a hole transport layer, an electron transport layer, or an electron injection layer may be additionally formed on or under the light emitting layer.

Subsequently, magnesium (Mg), calcium (Ca), aluminum (Al), silver (Ag), or an alloy thereof is deposited on the transparent substrate 400 including the organic layer 530 to form a second electrode 540. Hence, an organic light emitting diode 500 including the first electrode 510, the organic layer 530, and the second electrode 540 is formed.

Next, as shown in FIG. 4B, a base film 610 is provided. The base film 610 is a transparent film and may be formed of polyethylene terephthalate (PET) or polycarbonate (PC). Subsequently, an adhesive layer 620 is formed on the base film 610. The adhesive layer 620 is used to attach a film type barrier to the organic light emitting diode 500 and is formed using an acrylic resin or an epoxy resin through a screen printing method.

As described above, first block monomers, second block monomers, and inorganic precursors are melted in a solvent and then are mixed with a solution including inorganic precursors. The mixture solution is coated on the adhesive layer 620 using a spin coating method, a screen printing method, a slit coating method, etc. Subsequently, the self assembled structure is formed using the phase separation while volatilizing the solvent at a temperature equal to or lower than the ODT temperature, and the annealing process is additionally performed to form a barrier 650, in which first block monomer layers 630 and second block monomer layers 640 are alternately stacked. Thus, a barrier film 600, in which the adhesive layer 620, the first block monomer layers 630, and the second block monomer layers 640 are sequentially stacked on the base film 610, is formed.

Next, as shown in FIG. 4C, the base film 610 is removed while applying a pressure to the organic light emitting diode 500 formed on the transparent substrate 400, and the barrier film 600 thus manufactured is attached to the organic light emitting diode 500. Thus, the organic light emitting display shown in FIG. 2 is manufactured.

Hereinafter, the barrier according to the embodiment of the invention is described through the following example. However, the examples below are for merely exemplifying the embodiment of the invention, and therefore do not limit the embodiment of the invention.

Example

As a block copolymer including first block monomers and second block monomers, polystyrene-b-poly(ethylene oxide) (PS-b-PEO)(MW=21000 Da(PS=16,000/PEO=5,000)) was melted in THF:CHCl$_3$ (1:1) as a solvent to manufacture a high polymer solution. Al(Obu)$_3$, (3-glycidoxypropyl)trimethoxysilane, HCl, and water (H$_2$O) were mixed with one another to manufacture an inorganic precursor solution. The high polymer solution and the inorganic precursor solution thus manufactured were mixed with each other and were coated on the substrate using the spin coating method. Then, the annealing process was performed at about 25° C. to manufacture the barrier.

Figure 5:
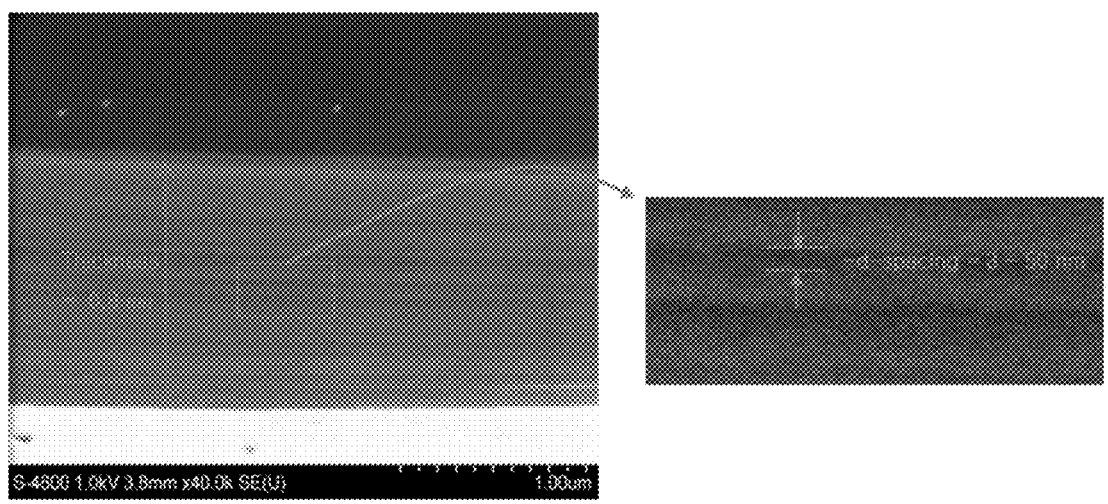
FIG. 5 shows a cross section of a barrier manufactured according to an example embodiment of the invention using a scanning electron microscope (SEM).

A cross section of the barrier thus manufactured was analyzed using a scanning electron microscope (SEM) and is shown in FIG. 5. As shown in FIG. 5, the barrier having a total thickness of about 0.8 μm was formed on the substrate. Further, PS layers as a first block and PEO+[GPTMS&Al(OBu)$_3$] layers, in which second blocks and inorganic precursors were combined, were alternately stacked on the substrate. In particular, the PEO+[GPTMS&Al(OBu)$_3$] layers had a thickness of about 30 nm to 50 nm, and lamellar patterns were formed parallel to one another on the substrate.

As described above, the organic light emitting display and the method for manufacturing the same according to the embodiment of the invention form the barrier using the block copolymer on the organic light emitting diode, thereby simplifying the manufacturing process and preventing a damage of the organic light emitting diode. Further, the organic light emitting display and the method for manufacturing the same according to the embodiment of the invention form the barrier having the stack structure of the organic layers and the inorganic layers, thereby preventing the moisture penetration from the outside.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An organic light emitting display comprising:
a substrate;
an organic light emitting diode positioned on the substrate, the organic light emitting diode including a first electrode, an organic layer, and a second electrode; and
a barrier configured to cover the organic light emitting diode, the barrier including at least one first block monomer layer and at least one second block monomer layer including inorganic precursors,
wherein the at least one first block monomer layer is an organic layer, and the at least one second block monomer layer is an inorganic layer, and
wherein the second electrode of the organic light emitting diode is further from the substrate than the first electrode, and the organic layer is either attached to the second electrode or closer to the second electrode than the inorganic layer.

2. The organic light emitting display of claim 1, wherein the at least one first block monomer layer and the at least one second block monomer layer are stacked based on a lamellar structure.

3. The organic light emitting display of claim 2, wherein the at least one first block monomer layer and the at least one second block monomer layer are alternately stacked in a vertical direction.

4. The organic light emitting display of claim 1, wherein the inorganic precursors are formed of any one selected from the group consisting of silicon-based material, aluminum-based material, zirconium-based material, zinc-based material, tin-based material, and rare earth-based material.

5. The organic light emitting display of claim 1, wherein a volume percentage of the at least one second block monomer layer is about 35% to 65% based on a total volume of 100% including the at least one first block monomer layer and the at least one second block monomer layer.

6. The organic light emitting display of claim 1, wherein the at least one first block monomer layer is a plurality of first block monomer layers and the at least one second block monomer layer is a plurality of second block monomer layers.

7. The organic light emitting display of claim 1, wherein the inorganic precursors have a melting temperature lower than 150° C.

* * * * *